United States Patent

Yazaryan et al.

[11] Patent Number: 5,838,533
[45] Date of Patent: Nov. 17, 1998

[54] HOUSING ASSEMBLY FOR CIRCUIT COMPONENTS

[75] Inventors: Berdj N. Yazaryan, Van Nuys; Vanacan Tatavoosian, Mission Vejo, both of Calif.

[73] Assignee: Eaton Corporation, Cleveland, Ohio

[21] Appl. No.: 816,794

[22] Filed: Mar. 19, 1997

[51] Int. Cl.$^6$ .................................................. H02B 1/00
[52] U.S. Cl. ....................... 361/600; 361/601; 361/614; 361/631; 361/735; 361/790; 174/52.1
[58] Field of Search .................... 361/600, 735, 361/730, 729, 790; 174/52.1, 52.2; 439/61

[56] References Cited

U.S. PATENT DOCUMENTS

| | | |
|---|---|---|
| 2,735,918 | 2/1956 | Darr . |
| 3,188,523 | 6/1965 | Yungkurth . |
| 3,309,577 | 3/1967 | Roll, Jr. ................................... 361/729 |
| 3,425,025 | 1/1969 | Williams ................................. 439/437 |
| 4,115,839 | 9/1978 | Hummel . |
| 4,251,853 | 2/1981 | Sites . |
| 4,401,351 | 8/1983 | Record ..................................... 361/735 |
| 4,679,121 | 7/1987 | Schomers ................................ 361/729 |
| 5,020,149 | 5/1991 | Hemmie ................................. 174/52.1 |
| 5,329,418 | 7/1994 | Tanabe . |

*Primary Examiner*—Leo P. Picard
*Assistant Examiner*—Boris L. Chervinsky
*Attorney, Agent, or Firm*—Tarolli, Sundheim, Covell Tummino & Szabo

[57] ABSTRACT

A housing assembly for electrical components includes a plurality of tubular housing sections which are fixedly interconnected. Portions of the housing sections are then removed to form openings in the housing assembly. The openings formed in the housing assembly may be formed in either interior or exterior walls of the housing assembly. Each of the tubular housing sections forms a compartment in which an electrical component may be mounted. By removing portions of a plurality of the interior walls of the housing assembly, a chamber which extends across end portions of a plurality of the compartments is formed. Front and rear end plates may be connected with the housing assembly. In addition, covers may be provided for openings formed in the exterior of the housing assembly.

5 Claims, 4 Drawing Sheets

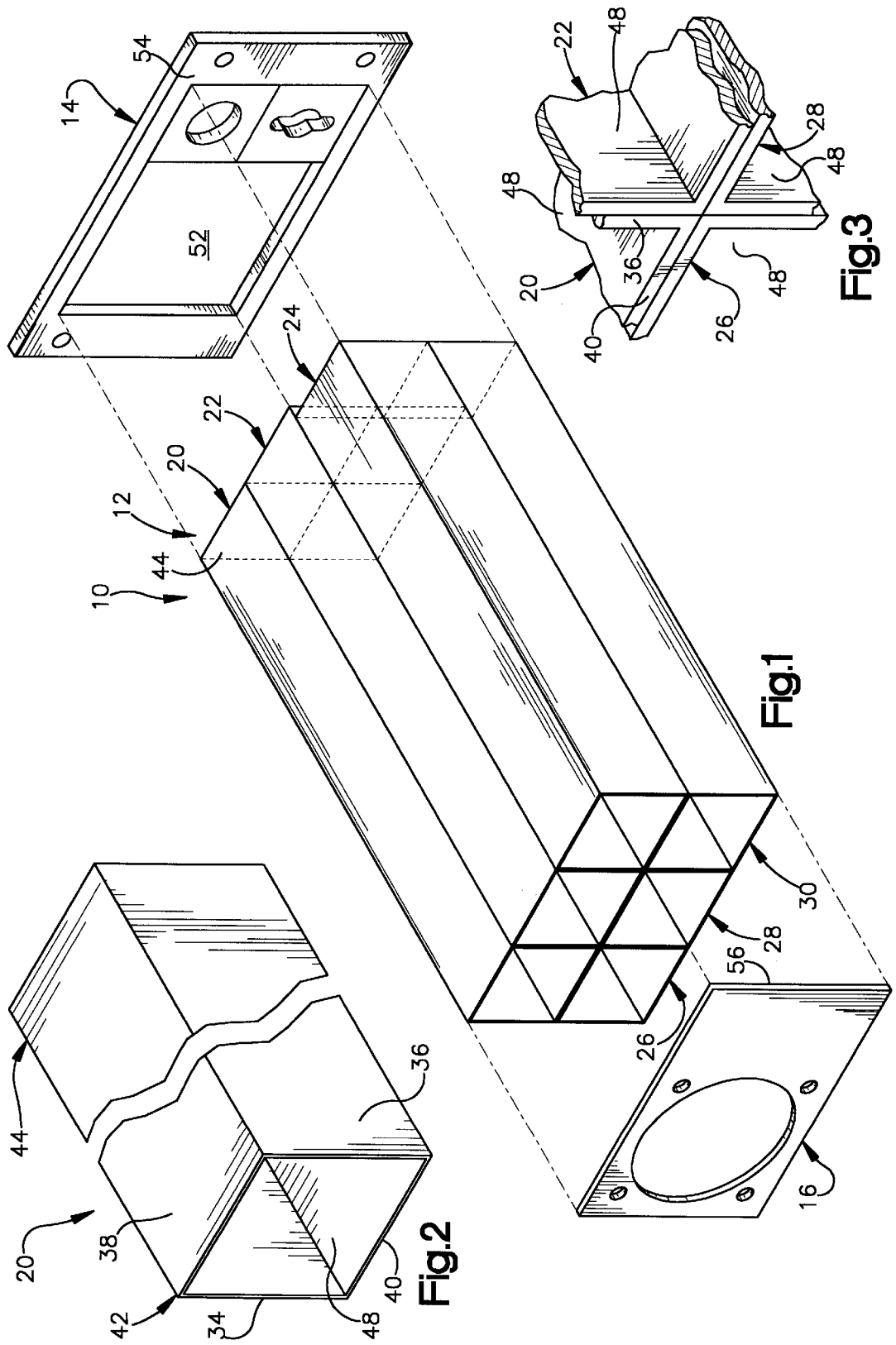

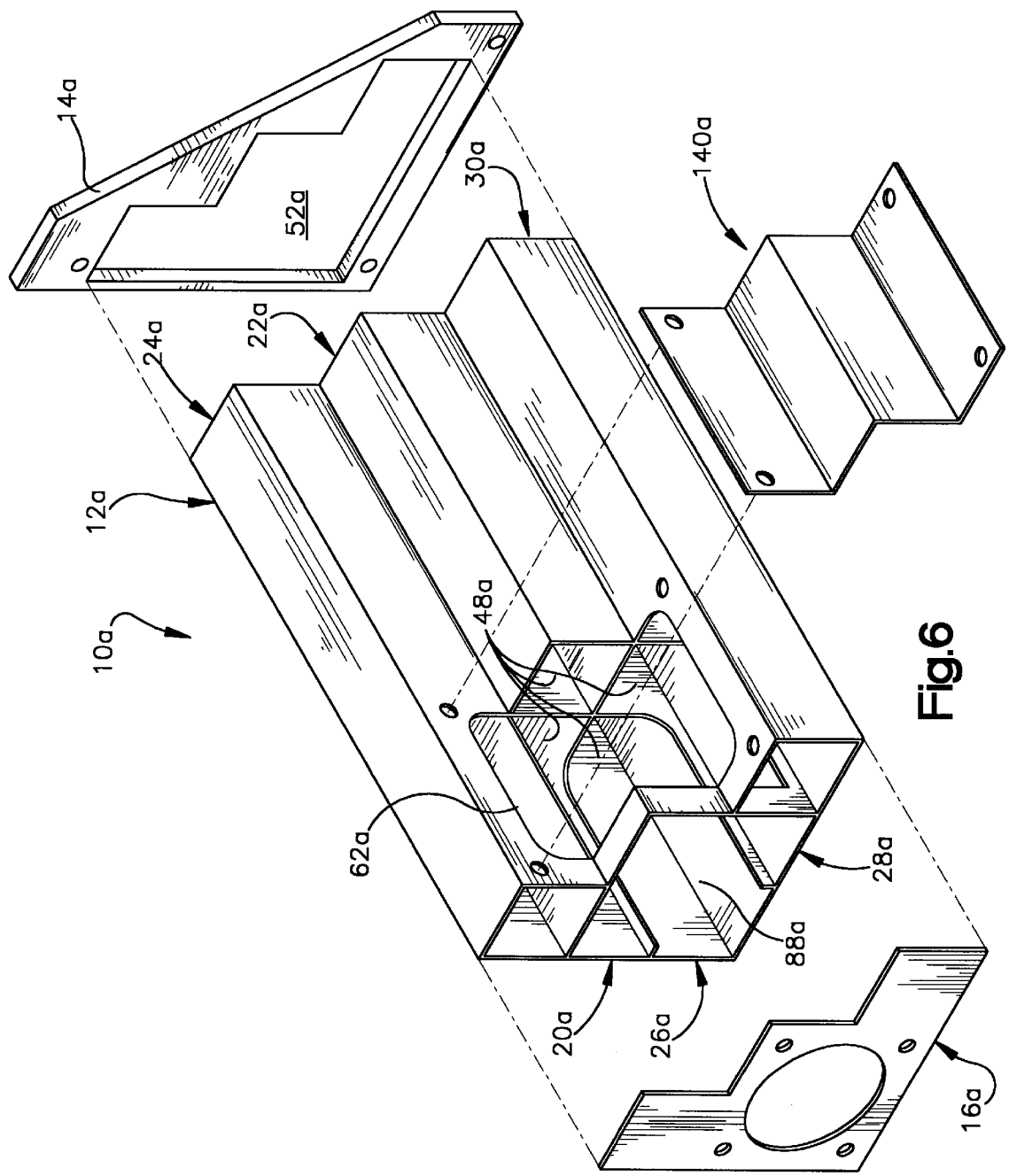

HOUSING ASSEMBLY FOR CIRCUIT COMPONENTS

BACKGROUND OF THE INVENTION

The present invention relates to a new and improved housing assembly for electrical circuit components.

Known housing assemblies for electrical circuit components are disclosed in U.S. Pat. Nos. 4,115,839 and 4,251,853. These patents disclose housing assemblies which are formed by interconnecting tubular housing sections. The electrical circuit components are mounted in compartments in each of the tubular housing sections. Other known housing assemblies for electrical circuit components are disclosed in U.S. Pat. Nos. 2,735,918; 3,188,523; and 5,329,418.

SUMMARY OF THE INVENTION

The present invention provides a new and improved housing assembly for electrical circuit components. The housing assembly has a unitized body which forms a unitary environmentally sealed structure. The housing assembly is formed by a plurality of tubular housing sections which are fixedly interconnected. The tubular housing sections may be interconnected to form a housing assembly having almost any desired configuration.

The tubular housing sections form compartments in which electrical circuit components are mounted. Openings are formed in side walls of the tubular housing sections to enable electrical circuit components to extend through the openings. Openings may be formed in the outer sides of one or more of the tubular housing sections to provide access to the interior of the housing assembly. The openings in the outer sides of one or more housing sections may be sealed by suitable covers.

It is contemplated that relatively large portions of side walls of the tubular housing sections may be removed within the housing assembly. This results in the formation of one or more chambers which extend across end portions of compartments in the housing assembly. This enables an electrical circuit component disposed in a chamber to be connected with electrical circuit components disposed in a plurality of the compartments.

BRIEF DESCRIPTION OF THE DRAWINGS

The foregoing and other features of the present invention will become more apparent upon a consideration of the following description taken in connection with the accompanying drawings, wherein:

FIG. 1 is an exploded pictorial illustration of components of a housing assembly prior to the forming of openings in the housing assembly;

FIG. 2 is a pictorial illustration of a tubular housing section which is used in the housing assembly of FIG. 1;

FIG. 3 is an enlarged fragmentary pictorial illustration depicting the manner in which side walls of a plurality of tubular housing sections are interconnected to form the housing assembly of FIG. 1;

FIG. 6 is an exploded pictorial illustration of a second embodiment of the housing assembly.

DESCRIPTION OF SPECIFIC PREFERRED EMBODIMENTS OF THE INVENTION

Housing Assembly—General Description

Figure 4:
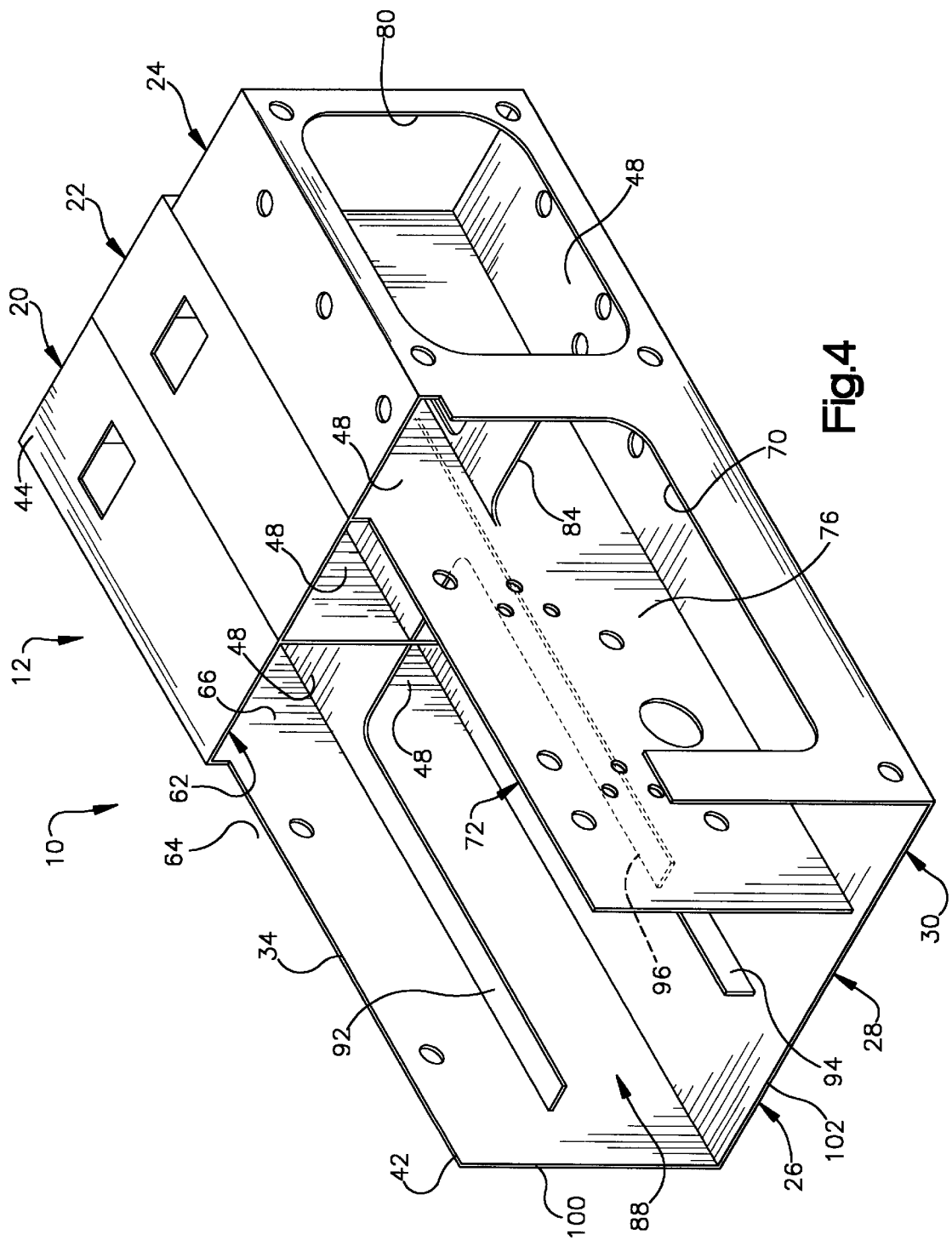
FIG. 4 is an enlarged pictorial illustration of a portion of the housing assembly of FIG. 1 after openings have been formed in side walls of the tubular housing sections.

A housing assembly 10 is illustrated in a partially completed condition in FIG. 1. The housing assembly 10 includes body 12, a front end plate or bezel 14, and a rear end plate or cover 16. In accordance with one of the features of the invention, the body 12 is formed by a plurality of fixedly interconnected tubular housing sections 20, 22, 24, 26, 28 and 30. It should be understood that the body 12 could be formed by a greater or lesser number of tubular housing sections disposed in a different spatial relationship relative to each other if desired.

The tubular housing sections 20–30 all have the same hollow rectangular construction. The tubular housing section 20 includes a pair of parallel upright side walls 34 and 36 (FIG. 2). A pair of parallel horizontal side walls 38 and 40 extend between and are perpendicular to the upright side walls 34 and 36.

The side walls 34–40 of the tubular housing section 20 all have the same elongated rectangular configuration. The side walls 34–40 have the same length and extend between a rear end portion 42 of the tubular housing section 20 and a front end portion 44 of the tubular housing section. The side walls 34–40 have the same width. The side walls 34–40 have a uniform thickness.

The parallel upright side walls 34 and 36 (FIG. 2) and the parallel horizontal side walls 38 and 40 cooperate to form a rectangular compartment 48 which is disposed within the tubular housing section 20. The rectangular compartment 48 has a longitudinal central axis which extends parallel to the side walls 34–40 and extends through the rear end portion 42 and front end portion 44 of the tubular housing section 20. The compartment 48 has a square cross sectional configuration as viewed in a plane extending perpendicular to the longitudinal central axis of the compartment. Each of the side walls 34–40 has flat, parallel, rectangular inner and outer side surfaces.

The tubular housing sections 20–30 (FIG. 1) are fixedly interconnected with flat outer side surfaces of the housing sections disposed in abutting engagement. Thus, a flat outer side surface on the upright side wall 36 of the tubular housing section 20 is positioned in abutting engagement with a flat outer side surface of an upright side wall on a tubular housing section 22 (FIG. 3). Similarly, a flat outer side surface on the horizontal side wall 40 of the tubular housing section 20 is placed in abutting engagement with a flat outer side surface on a horizontal upper side wall of the tubular housing section 26. The tubular housing section 22 has a horizontal lower side wall which engages a horizontal upper side wall of the tubular housing section 28. The tubular housing sections 26 and 28 have upright side walls which are disposed in engagement.

It should be understood that each of the tubular sections 20–30 (FIG. 1) has a longitudinally extending rectangular compartment 48 (FIG. 2) with the same configuration as the rectangular compartment of the tubular section 20. In the illustrated embodiment of the invention, the tubular housing sections 24 and 30 (FIG. 1) are slightly shorter than the tubular housing sections 20, 22, 26 and 28. This is due to the fact that the front end portions 44 of the tubular housing sections 20, 22, 26 and 28 are to extend into a rectangular opening 52 in the front end plate 14. Flat front end surfaces on the tubular housing sections 24 and 30 are to abut an inner major side surface 54 of the front end plate 14.

Of course, the opening 52 in the front end plate 14 could be sized to accept the front end portions of all of the tubular housing sections 20–30. If this was done, the tubular housing sections 20–30 would all have the same length. In the illustrated embodiment of the invention, the rear end plate 16 is mounted with a flat inner major side surface 56 in abutting engagement with rear end surfaces of the tubular housing sections 20–30.

The tubular housing sections 20–30, front end plate 14 and rear end plate 16 may be fixedly interconnected in any desired manner. However, it is preferred to interconnect the tubular housing sections 20–30 by welding or brazing the tubular housing sections together. The tubular housing sections 20–30 are formed of a suitable metal, that is, either aluminum or steel. The front end plate 14 and rear end plate 16 are welded or brazed to opposite ends of the tubular housing sections 20–30.

Although the tubular housing sections 20–30 all have the same configuration, it is contemplated that the tubular housing sections could have different configurations if desired. For example, a single tubular housing section could replace the two tubular housing sections 24 and 30. This single tubular housing section would have a height which is twice as great as the height of either one of the tubular housing sections 24 or 30. Similarly, the tubular housing sections 20 and 22 could be formed as a single tubular housing section having a width which is twice as great as the width of the tubular housing sections 20 and 22.

The size and shape of the tubular housing sections 20–30 will depend upon the size and shape of compartments 48 desired for the mounting of electrical circuit components. For example, at least some of the tubular housing sections 20–30 could have a triangular cross sectional configuration. Although the tubular housing sections 20–30 have been illustrated as being disposed in a rectangular array or block, it is contemplated that the tubular housing sections 20–30 could be arranged differently relative to each other to form a body 12 with a configuration which is different than the illustrated rectangular configuration. For example, the housing sections 20–30 could be arranged in an L-shaped array.

In the illustrated embodiment of the invention, the tubular housing sections 20–30 are formed of extruded aluminum. However, it is contemplated that the tubular housing sections 20–30 could be formed of a sheet metal, such as steel. The tubular metal housing sections 20–30 form a stiff unitary structure which can be environmentally sealed. In addition, the housing sections 20–30 can absorb heat transmitted from electrical circuit components disposed in the housing sections. The housing sections 20–30 are fixedly interconnected to form a strong structure which can withstand substantial forces.

Once the tubular housing sections 20–30 have been fixedly interconnected by suitable brazing or welding operations to form the body 12 (FIG. 1), portions of the side walls of the housing sections are removed to form openings in the side walls of the housing sections. The openings may be formed in either interior or exterior housing section side walls. The forming of the openings is facilitated by the strong interconnections which fixedly interconnect the housing sections 20–30. The specific configuration of the openings which are formed in the tubular housing sections 20–30 will depend upon the electrical circuit components which are to be disposed within the housing assembly 10.

The electrical circuit components disposed within the housing assembly may include switches, annunciators, circuit boards, solid state devices, cooling fans, dimmer logic, and wiring or other conductors. An electrical circuit component, such as a housing for a condenser or wiring, may extend through the openings formed in side walls 34–40 of the tubular housing elements 20–30 which form interior walls of the body 12. The arrangement of the openings in the side walls of the housing sections 20–30 will depend upon the specific electrical circuit components to be located in the housing assembly 10.

Access openings to the interior of the body 12 are formed in exposed side walls of the fixedly interconnected tubular housing sections 20–30. It is contemplated that access openings in the exposed side walls of the tubular housing sections 20–30 will facilitate the positioning of wiring and other circuit components in the housing sections. In order to provide an environmentally sealed body 12, suitable covers may be provided for openings formed in the exterior side walls of the tubular housing sections 20–30.

Forming a Housing Assembly

In accordance with one of the features of the invention, openings are formed in the side walls 36–40 of the tubular housing sections 20–30. Prior to initiating formation of the openings in the side walls 36–40 of the tubular housing sections 20–30, the tubular housing sections are fixedly interconnected. The connections between the housing sections 20–30 are strong enough to enable relatively large cutting forces and/or vibrational forces to be applied to the body 12 of the housing assembly 10 without moving the tubular housing sections relative to each other.

In the specific embodiment of the invention illustrated in FIG. 4, the body 12 of the housing assembly 10 was cut away to form a relatively large access opening 62 in the upper exterior side of the body 12 of the housing assembly 10. The access opening 62 was cut across the upper side walls of the fixedly interconnected tubular housing sections 20, 22 and 24. In addition, the access opening 62 was cut downward (as viewed in FIG. 4) into the exposed upright outer side walls of the fixedly interconnected tubular housing sections 20 and 24. The access opening 62 was also cut downward into upright interior side walls of the fixedly interconnected tubular housing sections 20, 22 and 24.

The access opening 62 (FIG. 4) extends from the rear end portion 42 of the tubular housing section 20 to a central portion of the housing section. Thus, a portion of the upright side wall 34 of the tubular housing section 20 was cut away to form a long thin longitudinally extending side portion 64 of the access opening 62. In addition, the upper side wall 38 (FIG. 2) was cut away to form a horizontally extending upper portion 66 (FIG. 4) of the access opening 62. The side and upper portions of the opening 62 extend from the rear end of the tubular housing section 20 to the central portion of the housing section.

The exposed horizontal upper side walls of the housing sections 22 and 24, corresponding to the horizontal upper side wall 38 of the tubular housing section 20 (FIG. 2) were also cut away. Therefore, the upper portion of the access opening 66 (FIG. 4) extends across the entire upper side of the body 12 of the housing assembly 10. In addition, the exposed vertical side wall of the tubular housing section 24 was cut away to form a portion of the opening 62 corresponding to the portion 64 of the opening.

Upright side walls of the tubular housing sections 24 and 30, corresponding to the upright side wall 36 (FIG. 2) of the tubular housing section 20, were cut away to form a relatively large side portion 70 (FIG. 4) of the access opening 62. The relatively large side portion 70 of the access opening 62 exposes a substantial surface area of an interior wall 72 of the body 12 of the housing assembly 10. The interior wall 72 is formed by upright side walls of the fixedly interconnected tubular housing sections 22, 24, 28 and 30.

The interior wall 72 is formed by upright side walls of the housing sections 22 and 28 corresponding to the upright side wall 36 of the tubular housing section 20 (FIG. 2). In addition, the interior wall 72 (FIG. 4) is formed by upright side walls of the housing sections 24 and 30 corresponding to the upright side wall 34 (FIG. 2) of the tubular housing section 20. The horizontal lower side wall 40 of the tubular housing section 24 has been cut away and the horizontal upper side wall 38 of the housing section 30 has been cut away so that a chamber 76 is formed.

The chamber 76 (FIG. 4) extends across end portions of the compartments 48 in the tubular housing sections 24 and 30. Thus, the chamber 76 has a height which is twice the height of either one of the compartments 48 in the tubular housing sections 24 and 30 and a width which is the same as the width of the compartment 48 in the tubular housing sections 24 and 30.

A second access opening 80 (FIG. 4) is formed in the side wall of the body 12. The second access opening 80 is formed in exposed upright side walls of the tubular housing sections 24 and 30. A horizontal interior wall 84 in the body 12 was cut away to provide access to the compartments 48 in the tubular housing sections 24 and 30. The horizontal interior wall 84 is formed by the lower horizontal side wall of the tubular housing section 24 and the upper horizontal side wall of the tubular housing section 30. By cutting away the lower and upper horizontal side walls of the tubular housing sections 24 and 30, a relatively large electrical circuit component can extend between the compartments 48 in the tubular housing sections 24 and 30.

The interior walls of the body 12 of the housing assembly 10 were cut away to form a relatively large chamber 88 (FIG. 4) which extends across end portions of compartments 48 disposed in tubular housing sections 20, 22, 26 and 28. The chamber 88 extends from the rear end portion 42 of the tubular housing sections 20, 22, 26 and 28 into the central portion of the tubular housing sections. In the illustrated embodiment of the invention, the chamber 88 extends forward from the rear end portion 42 of the tubular housing sections 20, 22, 26 and 28 for a distance which is equal to the distance which the chamber 76 extends forward from the rear end portions of the tubular housing sections 24 and 30. The relatively large upper portion 66 of the access opening 62 provides access to the chamber 88 and enables a relatively large electrical circuit component to be positioned in the chamber 88.

In forming the chamber 88, horizontal lower side walls of the tubular housing sections 20 and 22 were partially cut away. Horizontal upper side walls of the housing sections 26 and 28 were also partially cut away. In addition, vertical side walls of housing sections 20, 22, 26 and 28 were partially cut away. This resulted in the formation of longitudinally extending ribs 92, 94, and 96 along exterior walls 100 and 102 of the housing assembly 10 and along the interior wall 72 of the housing assembly.

The ribs 92 and 94 (FIG. 4) strengthened the exterior walls 100 and 102 of the housing assembly 10. The rib 96 strengthens the interior wall 72 of the housing assembly. The ribs 92, 94 and 96 have longitudinally extending minor side surfaces which engage an electrical circuit component to position the electrical circuit component in the chamber 88. The electrical circuit component engaged by the ribs 92, 94 and 96 may have either a cylindrical or rectangular configuration. For example, the electrical circuit component to be mounted in the chamber 88 may be a rectangular module.

Circular openings are provided at various locations in the side walls of the tubular housing sections 20–30 to facilitate the connection of a cover across the access openings 62 and 80. In addition, openings are provided in the side walls of the tubular housing sections 20–30 to facilitate mounting of electrical circuit components on the side walls. The specific size and shape of the openings in the side walls of the tubular housing sections 20–30 will depend on the specific electrical circuit components disposed in the housing assembly 10.

Suitable fasteners may extend through openings in the interior wall 72 (FIG. 4) to secure electrical circuit components to the interior wall 72. In addition, electrical wiring, housings, or other portions of electrical circuit components may extend through the openings in the interior wall 72. The specific arrangement of openings provided in the walls of the tubular housing sections 20–30 will depend upon the construction of the electrical circuit components which are to be mounted in the housing assembly 10.

The tubular housing sections 20–30 are fixedly interconnected, by a brazing or welding operation, prior to cutting away of material of the housing sections to form the openings in the housing sections. Once the tubular housing sections 20–30 have been fixedly interconnected, the tubular housing sections can be subjected to relatively large cutting forces without relative movement between the housing sections. Thus, drills, cutting tools, and other metal removing devices may be utilized to cut away the metal of the tubular housing sections 20–30. The openings which are formed in the side walls of the tubular housing sections are accurately positioned relative to each other. The strong interconnections between the tubular housing sections 20–30 enables them to be accurately machined without relative movement between the housing sections.

Figure 5:
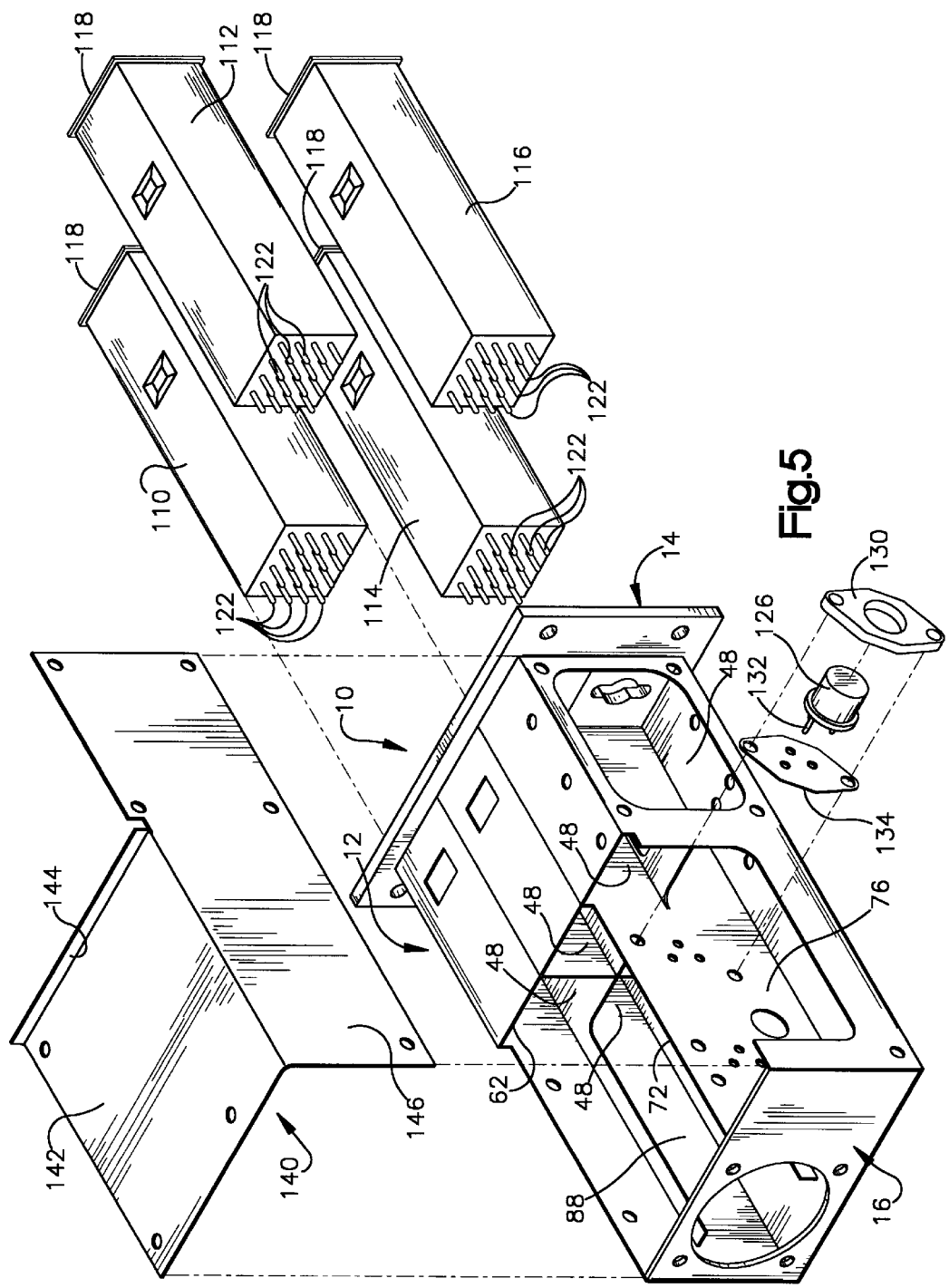
FIG. 5 is an exploded schematic pictorial illustration depicting the manner in which electrical circuit components are positioned in the housing assembly of FIG. 1 after openings have been formed in the housing assembly.

Once the side walls of the tubular housing sections 20–30 have been cut away to form the desired openings, the front end plate 14 (FIGS. 1 and 4) is connected with the front portion of the body 12 of the housing assembly 10. Similarly, the rear end plate 16 is connected with the rear end of the housing assembly 10 (FIG. 5). The front and rear end plates 14 and 16 extend parallel to each other and perpendicular to side walls 34–40 of the housing sections 20–30.

Suitable electrical circuit components are then positioned within the housing assembly 10. The housing assembly 10 functions as a heat sink for at least some of the electrical circuit components. In addition, the housing assembly 10 encloses the electrical circuit components and holds the electrical circuit components against movement relative to each other. Of course, the electrical circuit components may be fixedly connected to the side walls of the housing assembly 10 by suitable fasteners.

In the illustrated embodiment of the invention, the electrical circuit components include four electrical switches 110, 112, 114 and 116 (FIG. 5) that are positioned in compartments 48 formed by the tubular housing sections 20, 22, 26 and 28. The electrical switches 110–116 are of the same size as the compartments 48 into which they are inserted. Therefore, the inner side surfaces of the compartments 48 hold the electrical switches 110–116 against sidewise movement relative to the compartments. Engagement of the switches 110–116 with the inner side surfaces of the compartments 48 promotes heat transfer from the switches to the housing assembly 10.

The electrical switches 110–116 have rims or front flanges 118 (FIG. 5) which engage the front of the housing assembly 10 to seal the front of the housing assembly. The front flanges 118 on the switches 110–116 are rectangular and extend across the front end of the tubular housing sections 20, 22, 26 and 28. The front flanges or rims 118 on switches 110–116 block movement of foreign matter into the compartments 48 and block radiation of light from the compartments.

Electrical wiring and/or other electrical circuit components may be connected with terminals 122 at the ends of the switches 110–116. Access to the terminals 122 is provided through the access opening 62. Other electrical devices may be mounted in the housing assembly 10 along with the switches 110–116.

Electrical transformers, cooling apparatus and/or other devices may be mounted within the chambers 76 and 88 in the housing assembly 10. For example, a logic module may be mounted in the chamber 88 in engagement with the ribs 92, 94 and 96 (FIG. 4). Suitable electrical connectors extend between the logic module and the terminals 122 (FIG. 5) on the switches 112–116.

An electrical circuit component 126 (FIG. 5) may be secured to the interior wall 72 of the housing assembly 10 by a suitable mounting member 130. Terminals 132 on the electrical circuit component 126 extend through a gasket 134 and openings formed in the interior wall 72 of the housing assembly 10. The terminals 132 may be connected with the switches 110–116 or with electrical circuit components disposed in the chamber 88.

Once the desired electrical circuit components have been mounted within the housing assembly 10, a cover 140 (FIG. 5) is secured to the housing assembly. The metal cover 140 blocks the access opening 62 and the access opening 80 in the exposed exterior side walls of the housing assembly 10. Thus, the cover 140 includes a main section 142 which extends across the open upper side of the housing assembly 10. A flange 144 on the cover 140 projects upward to engage the exposed upper side wall of the housing assembly 10.

The cover 140 (FIG. 5) is provided with a flat upright side section 146 which extends across an exposed exterior side of the housing assembly 10. The side section 146 blocks the opening 80 and the vertically extending portion of the access opening 62. The cover 140 is secured to the housing assembly 10 by suitable fasteners. Other covers or seals may be provided so that all of the openings in the housing assembly 10 are sealed.

Housing Assembly—Second Embodiment

In the embodiment of the invention illustrated in FIGS. 1–5, the tubular housing sections 20–30 are interconnected to form a housing assembly body 12 having a rectangular block-like configuration. However, the tubular housing sections could be arranged in a different orientation relative to each other to form the housing assembly body with a different configuration if desired. In the embodiment of the invention illustrated in FIG. 6, the tubular housing sections are arranged in a stepped relationship. Since the embodiment of the invention illustrated in FIG. 6 is generally similar to the embodiment of the invention illustrated in FIGS. 1–5, similar numerals will be utilized to designate components of the embodiment of the invention illustrated in FIG. 6, the suffix letter "a" being associated with the numerals of FIG. 6 to avoid confusion.

In the embodiment of the invention illustrated in FIG. 6, a housing assembly 10a has a step-shaped body 12a. A front plate 14a is connected with a front end of the body 12a. A rear plate 16a is connected with the opposite or rear end of the body 12a.

The body 12a is formed by a plurality of tubular housing sections which are fixedly interconnected by a welding or brazing operation. Thus, the body 12a includes tubular housing sections 20a, 22a, 24a, 26a, 28a and 30a. When comparing the body 12a of the housing assembly 10a to the body 12 of the housing assembly 10 (FIG. 1), the tubular housing section 24 of the body 12 of the housing assembly 10 may be considered as being moved to a position on top of the tubular housing sections 20 of the body 12.

In the body 12a (FIG. 6) of the housing assembly 10a, the tubular housing section 24a is disposed on the horizontal upper side of the tubular housing section 20a. This results in the upper side of the tubular housing section 30a being exposed. The front plate 14a has an opening 52a into which the front end portions of the tubular housing sections 20a–30a are inserted.

The tubular housing sections 20a–30a each initially have the same rectangular configuration as the tubular housing section 20 of FIG. 2. The tubular housing sections 20a–30a are fixedly interconnected, by welding or brazing operations, to form the housing assembly 12a. The solidly interconnected housing sections 20a–30a are then cut away to form a chamber 88a which extends across ends of compartments 48a in the tubular housing sections 20a, 22a, 26a, and 28a. An access opening 62a is formed in the side walls of the tubular housing sections 24a, 22a, and 30a. A cover 140a is provided to seal the access opening 62a.

After the tubular housing sections 20a–30a have been fixedly interconnected, the material of the tubular housing sections is cut away to form the chambers 88a and the access opening 62a. The front end plate 14a and the rear end plate 16a are then connected with the body 12a of the housing assembly 10a. Electrical circuit components are then inserted into the compartments 48a in the tubular housing sections 20a–30a and into the chamber 88a. The electrical circuit components may include switches, similar to the switches 110–116 of FIG. 5, cooling apparatus, logic modules, electrical wiring, and solid state devices. Of course, the specific electrical components which are mounted in the housing assembly 10a will depend upon the apparatus with which the housing assembly is to be associated.

After the electrical circuit components have been mounted in the housing assembly 10a, the cover 140 is positioned over the access opening 62a. Other openings in the housing assembly 10a are also closed. This results in a strong unitary housing assembly 10a which is environmentally sealed.

Conclusion

In view of the foregoing description, it is apparent that the present invention provides a new and improved housing assembly 10 for electrical circuit components, such as the switches 110–116 and other devices. The housing assembly 10 has a unitized body 12 which forms a unitary environmentally sealed structure. The housing assembly 10 is formed by a plurality of tubular housing sections 20–30 which are fixedly interconnected. The tubular housing sections 20–30 may be interconnected to form a housing assembly 10 having almost any desired configuration.

The tubular housing sections 20–30 form compartments 48 in which electrical circuit components, such as the switches 110–116, are mounted. Openings are formed in side walls of the tubular housing sections to enable electrical circuit components to extend through the openings. Openings 62 and 80 may be formed in the outer sides of one or more of the tubular housing sections 20–30 to provide access to the interior of the housing assembly 10. The openings in the outer sides of the housing sections 20–30 may be sealed by suitable covers 140.

It is contemplated that relatively large portions of side walls of the tubular housing sections 20–30 may be removed within the housing assembly. This results in the formation of one or more chambers 76 and 88 which extend across end portions of compartments 48 in the housing assembly 10. This enables an electrical circuit component disposed in a chamber to be connected with electrical circuit components disposed in a plurality of the compartments.

Having described the invention, the following is claimed:

1. An apparatus comprising a plurality of tubular housing sections, a plurality of electrical circuit components disposed in said tubular housing sections, a first tubular housing section of said plurality of tubular housing sections having first and second parallel side walls and third and fourth parallel side walls which extend perpendicular to said first an second parallel side walls, said first tubular housing section having a first compartment which is at least partially defined by said first, second, third and fourth side walls, said plurality of electrical circuit components includes a first electrical circuit component which is at least partially disposed in said first compartment, a second tubular housing section of said plurality of tubular housing sections having fifth and sixth parallel side walls and seventh and eighth parallel side walls which extend perpendicular to said fifth and sixth parallel side walls and perpendicular to said first and second side walls of said first tubular housing section, said second side wall of said first tubular housing section being disposed in abutting engagement with said fifth side wall of said second tubular housing section, said second tubular housing section having a second compartment which is at least partially defined by said fifth, sixth, seventh and eighth side walls, said plurality of electrical circuit components includes a second electrical circuit component which is at least partially disposed in said second compartment, a third tubular housing section of said plurality of tubular housing sections having ninth and tenth parallel side walls and eleventh and twelfth parallel side walls which extend perpendicular to said ninth and tenth parallel side walls and perpendicular to said first and second side walls of said first tubular housing section, said eleventh side wall of said third tubular housing section being disposed in abutting engagement with said fourth side wall of said first tubular housing section, said third tubular housing section having a third compartment which is at least partially defined by said ninth, tenth, eleventh and twelfth side walls, said plurality of electrical circuit components includes a third electrical circuit component which is at least partially disposed in said third compartment, a fourth tubular housing section of said plurality of tubular housing sections having thirteenth and fourteenth parallel side walls and fifteenth and sixteenth parallel side walls which extend perpendicular to said thirteenth and fourteenth parallel side walls and to said first and second side walls of said first tubular housing section, said thirteenth side wall of said fourth tubular housing section being disposed in abutting engagement with said tenth side wall of said third tubular housing section, said fifteenth side wall of said fourth tubular housing section being disposed in abutting engagement with said eighth side wall of said second tubular housing section, said fourth tubular housing section having a fourth compartment which is at least partially defined by said thirteenth, fourteenth, fifteenth, and sixteenth side walls, said plurality of electrical circuit components includes a fourth electrical circuit component which is at least partially disposed in said fourth compartment, means for interconnecting said first, second, third and fourth tubular housing sections to at least partially define a housing assembly, said first, sixth, ninth, twelfth, fourteenth and sixteenth side walls of said tubular housing sections have surfaces which cooperate to at least partially define a chamber which extends across end portions of said first, second, third and fourth compartments, and electrical circuit elements are at least partially disposed in said chamber and are connected with said first, second, third and fourth electrical circuit components disposed in said first, second, third and fourth compartments.

2. An apparatus as set forth in claim 1 further including surface means for at least partially defining an opening which extends through said sixth and seventh side walls of said second tubular housing section to provide access to said chamber.

3. An apparatus as set forth in claim 1 wherein said chamber extends through said second and fourth side walls of said first tubular housing section, said chamber extends through said fifth and eighth side walls of said second tubular housing section, said chamber extends through said tenth and eleventh side walls of said third tubular housing section, and said chamber extends through said thirteenth and fifteenth side walls of said fourth tubular housing section.

4. An apparatus as set forth in claim 1 wherein said first tubular housing section has a first end which is at least partially defined by end surfaces on said first, second, third, and fourth side walls, said second tubular housing section having a first end which is at least partially defined by end surfaces on said fifth, sixth, seventh, and eighth side walls, said first electrical circuit component has a first rim portion which overlies said end surfaces on said first, second, third, and fourth side walls of said first tubular housing section and a first body portion which extends from said first rim portion and is at least partially disposed in said first compartment in said first tubular housing section, said second electrical circuit component has a second rim portion which overlies said end surfaces on said fifth, sixth, seventh and eighth side walls of said second tubular housing section and a second body portion which extends from said second rim portion and is at least partially disposed in said second compartment in said second tubular housing section.

5. An apparatus as set forth in claim 1 further including surface means for defining an opening which is at least partially defined by said third side wall of said first tubular housing section and said seventh side wall of said second tubular housing section, and cover means for blocking said opening, said cover means being a single member which spans the opening along said third side wall of said first tubular housing section and said seventh side wall of said second tubular housing section.

\* \* \* \* \*